United States Patent
Hampel et al.

(10) Patent No.: US 8,028,144 B2
(45) Date of Patent: Sep. 27, 2011

(54) MEMORY MODULE WITH REDUCED ACCESS GRANULARITY

(75) Inventors: Craig E. Hampel, Los Altos, CA (US); Frederick A. Ware, Los Altos Hills, CA (US)

(73) Assignee: RAMBUS Inc., Sunnyvale, CA (US)

( * ) Notice: Subject to any disclaimer, the term of this patent is extended or adjusted under 35 U.S.C. 154(b) by 0 days.

(21) Appl. No.: 12/392,071

(22) Filed: Feb. 24, 2009

(65) Prior Publication Data
US 2009/0157994 A1   Jun. 18, 2009

Related U.S. Application Data

(63) Continuation of application No. 11/381,349, filed on May 2, 2006.

(51) Int. Cl.
*G06F 12/00* (2006.01)

(52) U.S. Cl. ............ 711/168; 711/4; 711/100; 711/103; 711/111; 711/112; 711/114; 711/115; 711/147; 711/148; 711/149; 711/150; 711/152; 711/167; 710/36; 710/37; 710/38; 710/20; 710/21; 710/305; 710/309; 710/310

(58) Field of Classification Search .............. 711/4, 100, 711/103, 111–112, 114–115, 147–150, 152, 711/167–168; 710/20–21, 200, 305, 309, 710/36, 37–38
See application file for complete search history.

(56) References Cited

U.S. PATENT DOCUMENTS

| 5,892,981 | A | 4/1999 | Wiggers .................. 395/878 |
| 6,160,750 | A * | 12/2000 | Shieh .................. 365/230.03 |
| 6,240,040 | B1 * | 5/2001 | Akaogi et al. ........... 365/230.06 |
| 6,363,454 | B1 * | 3/2002 | Lakhani et al. ............. 711/100 |
| 6,687,796 | B1 | 2/2004 | Laine et al. .................. 711/149 |
| 6,742,098 | B1 | 5/2004 | Halbert et al. ................ 711/172 |
| 6,813,688 | B2 * | 11/2004 | Wu et al. ..................... 711/114 |
| 6,877,079 | B2 * | 4/2005 | Yoo et al. .................... 711/167 |
| 2004/0177210 | A1* | 9/2004 | Choi .............................. 711/5 |
| 2006/0004976 | A1 | 1/2006 | Rader ........................... 711/167 |
| 2006/0047899 | A1* | 3/2006 | Ilda et al. .................... 711/113 |

OTHER PUBLICATIONS

International Search Report and the Written Opinion of the International Searching Authority for PCT/US2007/067814, European Patent Office, Feb. 29, 2008, 18 pages.

\* cited by examiner

*Primary Examiner* — Tuan Thai
*Assistant Examiner* — Zhuo Li

(57) ABSTRACT

A memory module having reduced access granularity. The memory module includes a substrate having signal lines thereon that form a control path and first and second data paths, and further includes first and second memory devices coupled in common to the control path and coupled respectively to the first and second data paths. The first and second memory devices include control circuitry to receive respective first and second memory access commands via the control path and to effect concurrent data transfer on the first and second data paths in response to the first and second memory access commands.

31 Claims, 6 Drawing Sheets

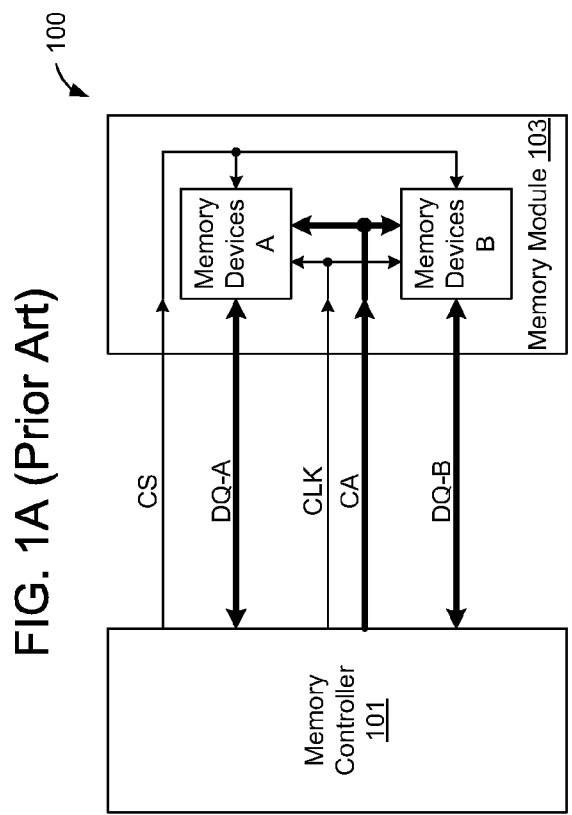
FIG. 1A (Prior Art)
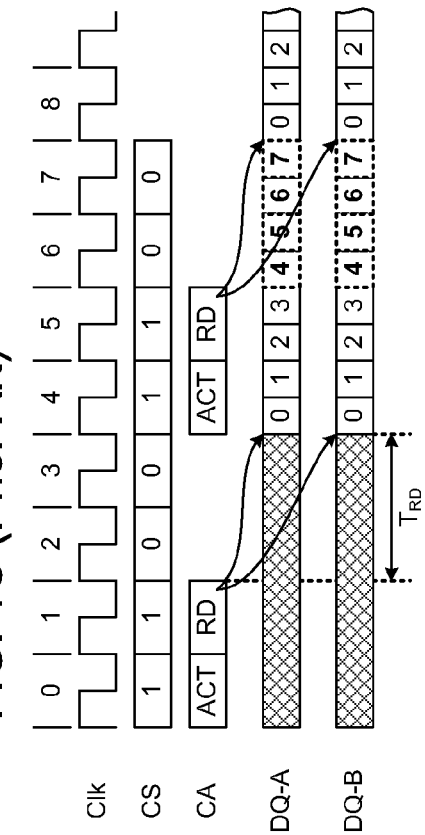
FIG. 1C (Prior Art)
FIG. 1B (Prior Art)

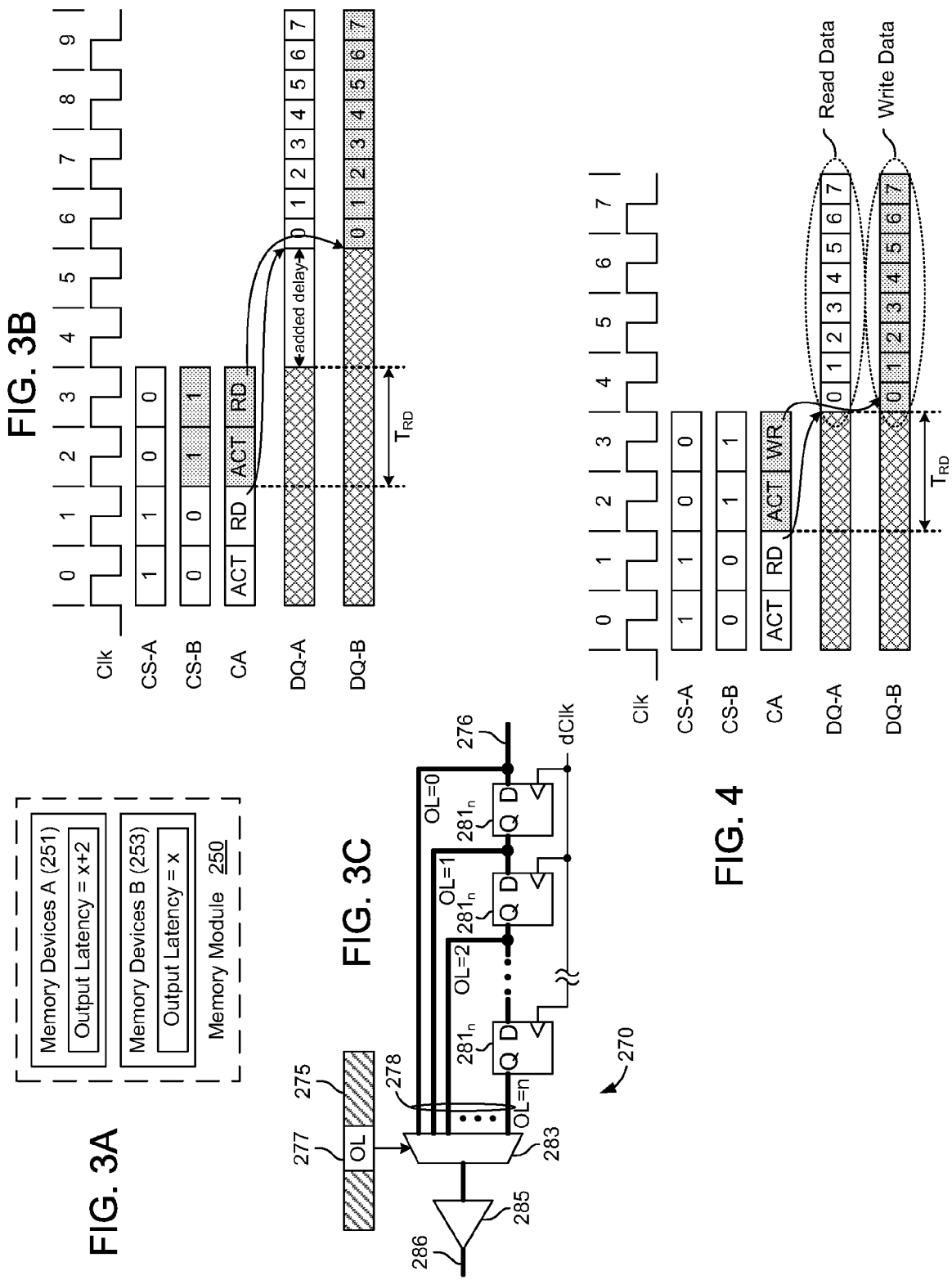

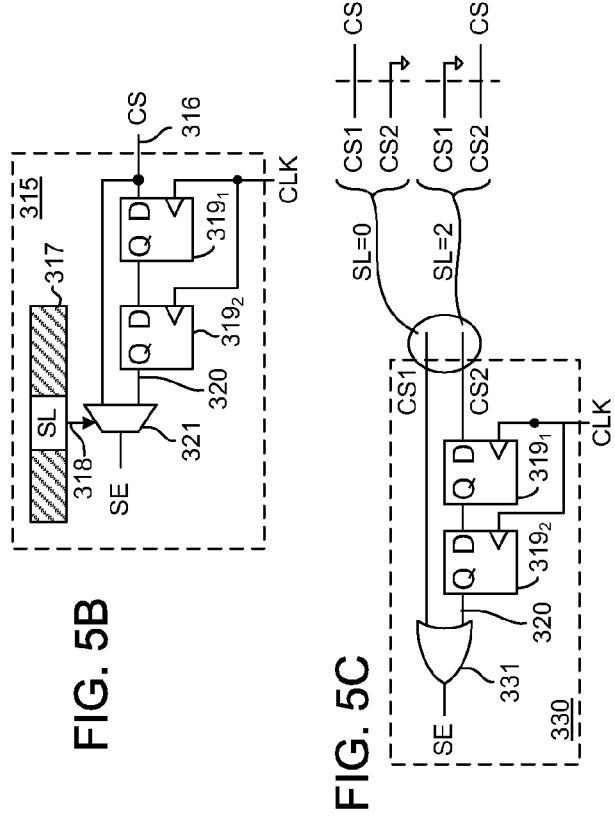
FIG. 5B
FIG. 5C
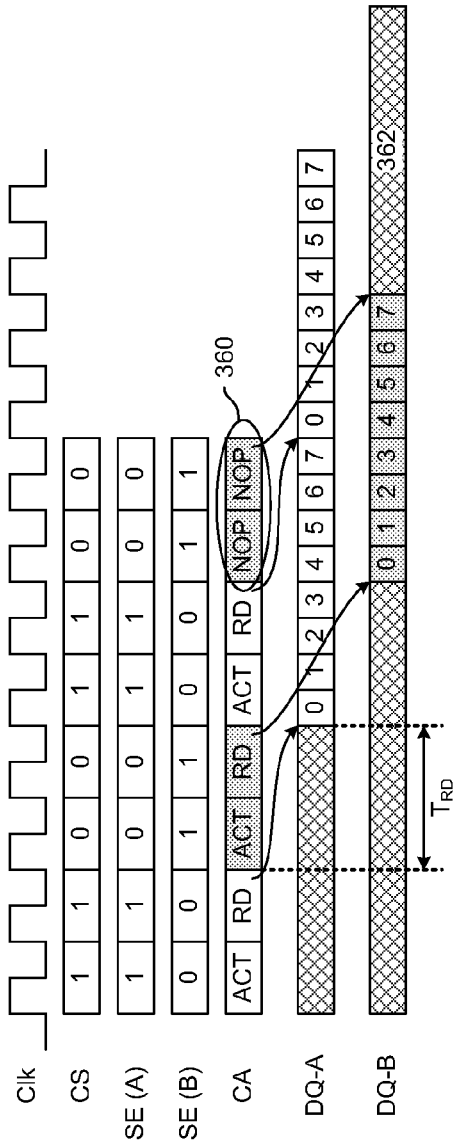
FIG. 5E
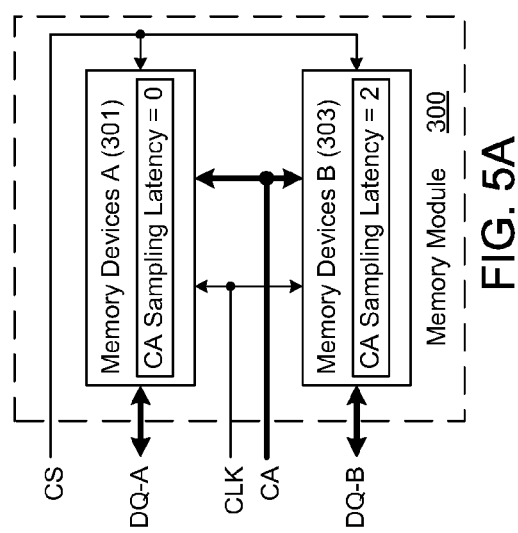
FIG. 5A
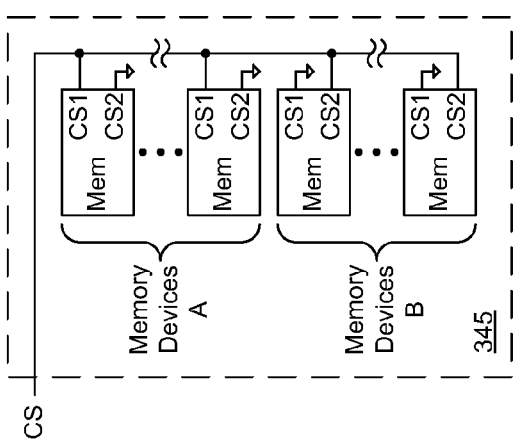
FIG. 5D

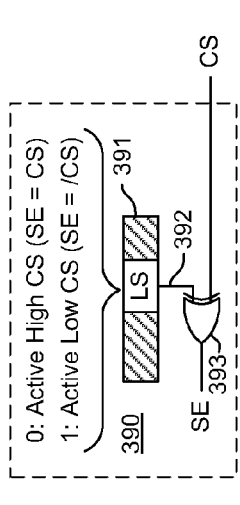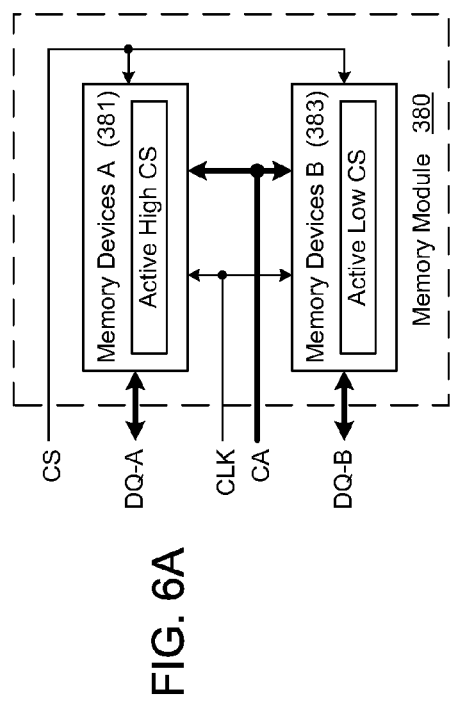

US 8,028,144 B2

MEMORY MODULE WITH REDUCED ACCESS GRANULARITY

RELATED APPLICATIONS

This application is a continuation of U.S. patent application Ser. No. 11/381,349, filed May 2, 2006, entitled MEMORY MODULE WITH REDUCED ACCESS GRANULARITY, which is hereby incorporated by reference in its entirety.

TECHNICAL FIELD

The present invention relates to data storage methods and systems.

BACKGROUND

Signaling rate advances continue to outpace core access time improvement in dynamic random access memories (DRAMs), leading to memory devices and subsystems that output ever larger amounts of data per access in order to meet peak data transfer rates. In many cases, the increased data output is achieved through simple extension of the output burst length; the number of data transmissions executed in succession to output data retrieved from a given location within the memory core. FIGS. 1A-1C illustrate this approach within a prior-art memory system 100 formed by memory controller 101 and memory module 103. Memory module 103 includes two sets of memory devices, shown in grouped form as memory devices A and memory devices B, with all the memory devices coupled to a shared command/address path (CA), shared clock line (CLK) and shared chip-select line (CS), and with memory devices A coupled to a first set of data lines, DQ-A, and memory devices B coupled to a second set of data lines, DQ-B. Referring to FIG. 1B, the memory controller initiates a memory access by outputting a row activation command (ACT) and column access command (RD) and associated row and column address values onto the command/address path during successive cycles, 0 and 1, of a clock signal (Clk), asserting the chip-select signal (i.e., CS=1) during both clock cycles. All the memory devices (i.e., memory devices A and memory devices B) respond to assertion of the chip-select signal by sampling the command/address path during clock cycles 0 and 1 to receive the row activation command and the column access command, collectively referred to herein as a memory access command. Thereafter, each of the A and B memory devices responds to the memory access command received during clock cycles 0 and 1 by activating the address-specified row within the memory core, then retrieving read data from the address-specified column within the activated row. Accordingly, some time, $T_{RD}$, after receipt of the memory access command, the read data values retrieved within each of the A and B memory devices are output in parallel data burst sequences (i.e., with each transmission within the burst sequence being consecutively numbered, 0-3) on data lines DQ-A and DQ-B during clock cycles 4 and 5. By this operation, memory access transactions may be pipelined so that the memory access command for a given transaction is transmitted simultaneously with data transmission for a previously-transmitted memory access command. Because the data burst length (sometimes called "prefetch") matches the memory access command length, the command/address and data path resources may be fully utilized during periods of peak data transfer.

FIG. 1C illustrates a timing arrangement that may result as the data and command signaling rates are doubled relative to the core access time. As shown, the amount of data retrieved from the memory core is doubled in order to meet the increased bandwidth of the data interface, thereby extending the data burst length by an additional two clock cycles (i.e., as shown by transmissions 4-7 during clock cycles 6 and 7) on data lines DQ-A and DQ-B and doubling the granularity of the memory access. The extended burst length and resulting increased access granularity produces two potentially undesirable effects. First, because the trend in a number of data processing applications is toward finer-grained memory access, the increased data burst length may result in retrieval and transmission of a substantial amount of unneeded data, wasting power and increasing thermal loading within the memory devices. Additionally, utilization of the command/address and data path resources is thrown out of balance as the extended burst length prevents memory access commands from being transmitted back-to-back (i.e., in successive pairs of clock cycles) and thus results in periods of non-use on the command/address path.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A-1C illustrate a prior-art memory module and timing of memory access operations therein;

FIG. 3A illustrates an embodiment of a memory module having memory devices that may be programmed to establish a desired delay between receipt of a column access command and data output;

FIG. 3B illustrates a pipelined sequence of memory transactions that may be carried out in the memory module of FIG. 3A;

FIG. 3C illustrates an embodiment of a latency-control circuit that may be provided within individual memory devices to establish selected output latencies;

FIG. 4 illustrates concurrent read and write memory accesses that may be carried concurrently within memory sub-ranks in the memory modules of FIGS. 2A and 3A;

Figure 8:
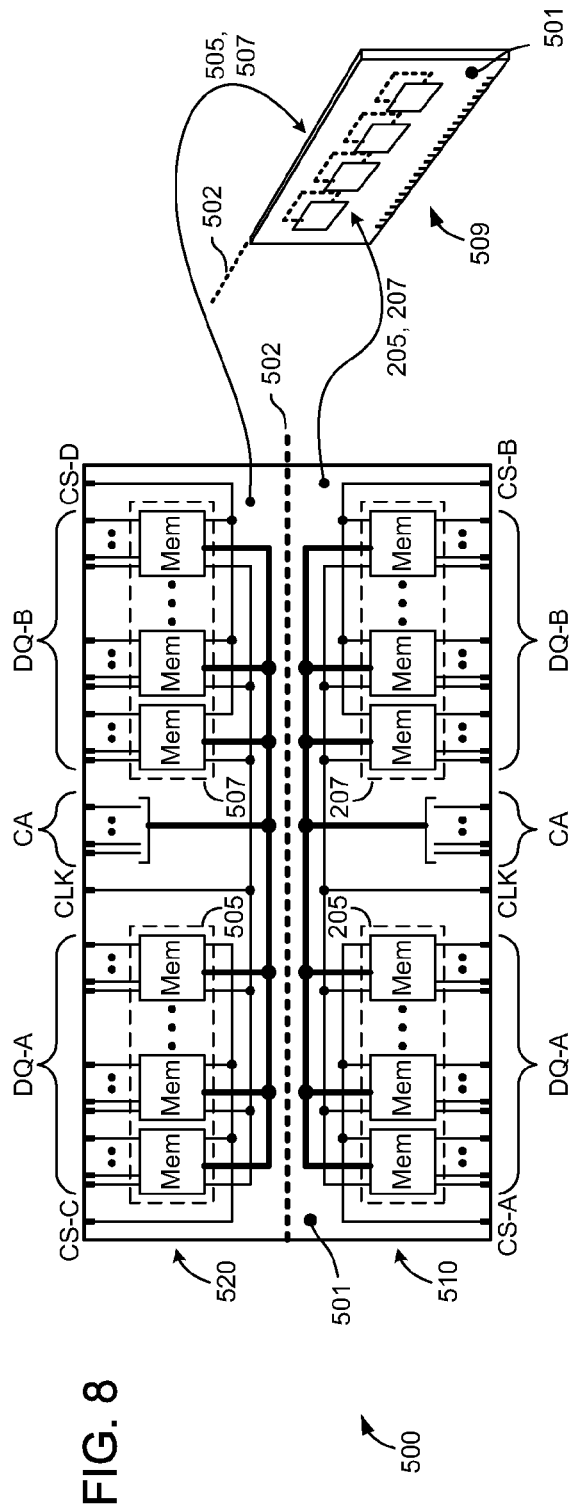
Figure 9:
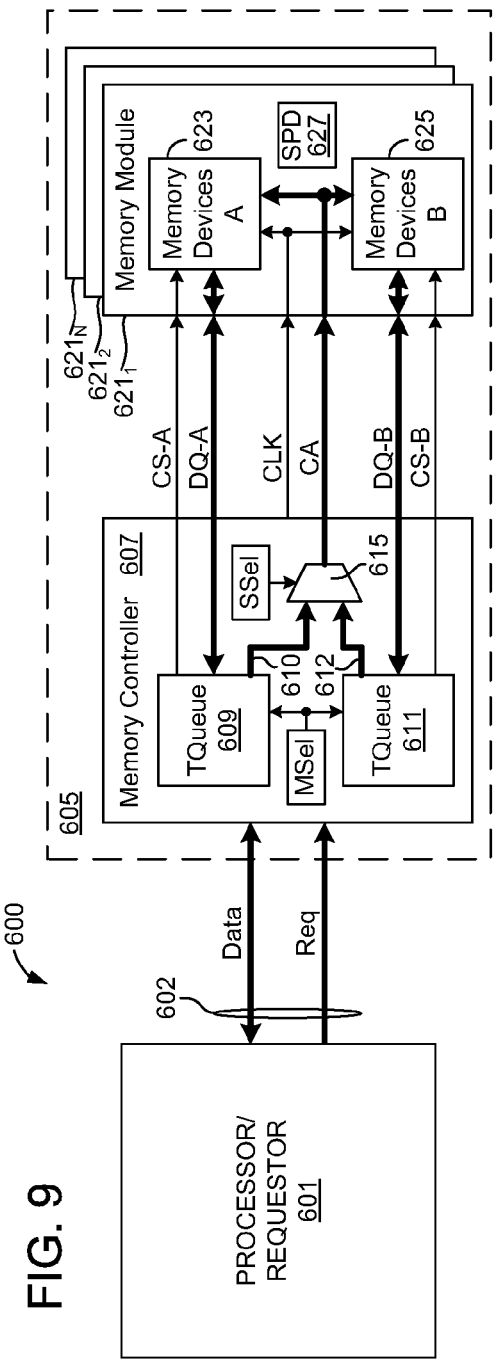

using the memory modules of FIG. 3A;

FIG. 5A illustrates an embodiment of a memory module that supports independent access to memory sub-ranks and using a shared chip-select line;

FIG. 5B illustrates an embodiment of a sampling-latency control circuit that may be included within individual memory devices of FIG. 5A to control command/address sampling latencies;

FIG. 5C illustrates an alternative embodiment of a circuit for controlling the command/address sampling latency within a memory device;

FIG. 5D illustrates a memory module having dual-chip-select memory devices as in FIG. 5C, and an exemplary connection of a shared chip-select line to the memory devices to establish independently accessible memory sub-ranks;

FIG. 5E illustrates a pipelined sequence of memory transactions that may be carried out in the memory modules of FIGS. 5A and 5D;

FIG. 6A illustrates an alternative embodiment of a memory module that supports independent access to memory sub-ranks using a shared chip-select line;

FIG. 6B illustrates an embodiment of a level control circuit that may be included within the individual memory devices of FIG. 6A to control chip-select assertion polarity;

FIG. 6C illustrates an alternative embodiment of a circuit for controlling the chip-select assertion polarity in a memory device;

FIGS. 7A-7C illustrate an alternative approach for enabling independent access to memory sub-ranks using device identifiers;

FIG. 8 illustrates a memory module having multiple memory ranks, with each memory rank including separately accessible memory sub-ranks; and FIG. 9 illustrates an embodiment of a data processing system having a memory subsystem that supports concurrent, independent access to memory sub-ranks on one or more memory modules.

DETAILED DESCRIPTION

Memory systems and memory modules that enable more efficient use of signaling resources and reduced memory access granularity are disclosed in various embodiments. In one embodiment, two or more sets of memory devices disposed on a memory module and coupled to respective portions of a data path may be independently accessed via a shared command/address path and thus enable two or more reduced-granularity memory transactions to be carried out concurrently with the data for each transaction transferred on a respective portion of the data path. In a particular embodiment, independent access to the memory device sets coupled to respective portions of the data path is achieved by providing a separate chip-select line for each memory device set. By asserting chip-select signals on the separate chip-select lines at different times, the corresponding sets of memory device are enabled to sample commands and address values transferred via the shared command/address path at different times, in effect, time-multiplexing the shared command/address path to enable the different memory device sets to receive distinct commands and corresponding addresses. Consequently, by staggering the commands sent to each memory device, multiple independent memory access operations may be initiated and executed concurrently (i.e., at least partly overlapping in time) within the memory module, with the data transferred to or from the memory module in each memory access having reduced granularity relative to the granularity of a single memory access transaction directed to all the memory devices coupled to the complete data path. Further, because additional bandwidth may naturally become available on the command/address path as output data burst rates are extended (i.e., as signaling rates increase), the increased command/address bandwidth may be applied to convey the additional commands/addresses supplied to each additional independently accessible set of memory devices, thereby enabling full and efficient use of signaling resources. Alternative techniques for enabling independent memory access operations within sets of memory devices coupled to respective portions of the memory-module data path include, for example and without limitation, establishing different command/address sampling instants within different sets of memory devices relative to activation of a shared chip-select line, establishing different chip-select assertion polarities within different sets of memory devices, and including chip identifier values within or in association with command/address values. These and other features and techniques are disclosed in further detail below.

Figures 2A, 2B:
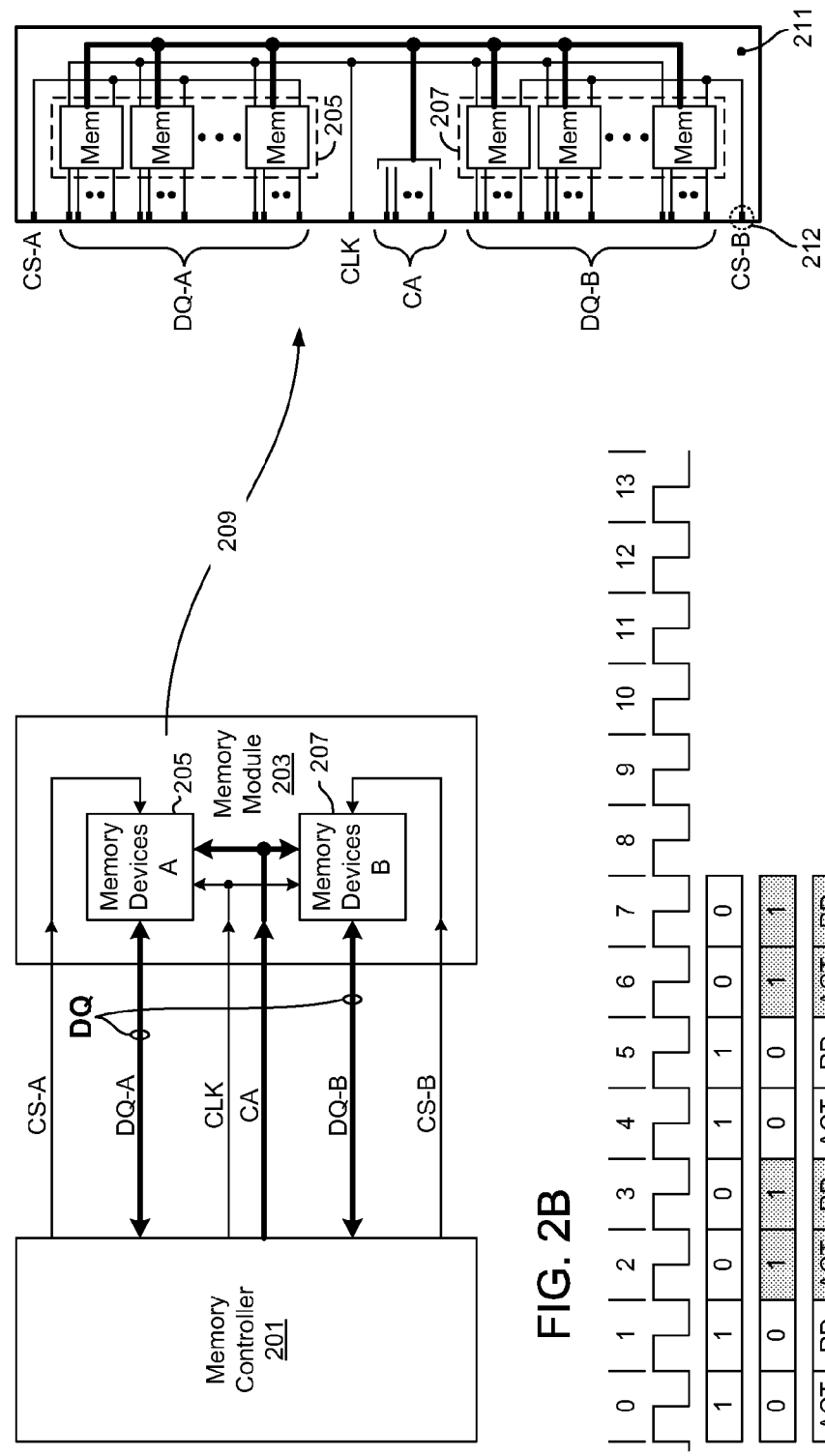
FIG. 2A illustrates a memory system having a memory controller and reduced-granularity memory module according to one embodiment.
FIG. 2B illustrates a pipelined sequence of memory transactions that may be carried out within the memory system of FIG. 2A.

FIG. 2A illustrates a memory system 200 having a memory controller 201 and reduced-granularity memory module 203 according to one embodiment. The memory controller 201 and memory module 203 are coupled to one another via a command/address path (CA), one or more clock lines (CLK), chip-select lines (CS-A and CS-B) and data path (DQ) which, as shown, includes component data paths DQ-A and DQ-B. The memory module 203 includes two sets of memory devices, A and B (205 and 207), referred to herein as memory sets, with each memory set coupled to a respective one of the component data paths, DQ-A and DQ-B, and both memory sets coupled in common to the command/address path (also referred to herein as a control path) and the one or more clock lines, thus establishing the command/address path and clock line as shared resources for all the memory devices on the memory module 203. In the particular embodiment shown, each of the memory sets 205 and 207 is additionally coupled to a respective one of the two chip-select lines, CS-A and CS-B, thereby enabling each memory set to be independently accessed as described in more detail below. Command and address values may be transferred in time-multiplexed fashion via the command/address path (also referred to herein as a command path or control path) or, alternatively, the command/address path may be wide enough to convey commands and associated address values in parallel.

In one embodiment, shown in detail view 209, the memory module 203 is implemented by a printed circuit board substrate 211 having signal lines disposed thereon and extending from connector contacts 212 at an edge or other interface of the substrate 211 to memory devices, "Mem," and thus forming the on-board portion of the command/address path (CA), component data paths (DQ-A and DQ-B), chip-select lines (CS-A and CS-B) and clock line (CLK). As shown, each memory device within a given memory set 205, 207 is coupled to a respective subset of signal lines within the component data path, DQ-A or DQ-B (the component data paths themselves being formed by subsets of the signal lines that form the overall module data path, DQ as shown in system 200), but coupled in common to the chip-select line, CS-A or CS-B, for the memory set. By contrast, the clock line and command/address path is coupled in common to (i.e., shared by) all the memory devices of the memory module. As a matter of terminology, the collective group of memory devices coupled in parallel to the data lines that constitute the full data path, DQ, is referred to herein as a memory device rank or memory rank, while the independently selectable sets of memory devices coupled to respective subsets of the data lines are referred to herein as memory device sub-ranks or memory sub-ranks. Thus, in FIG. 2A, the memory devices within memory sets 205 and 207 collectively constitute a memory rank (i.e., coupled to all the data lines of the data path, DQ), while the memory devices within memory set 205 constitute a first memory sub-rank coupled to the DQ-A signal lines, and the memory devices within memory set 207 constitute a second memory sub-rank coupled to the DQ-B signal lines. Note that while a two-sub-rank embodiment is shown in FIG. 2A and carried forward in other exemplary embodiments described below, in all such cases, memory ranks may each be decomposed into more than two memory sub-ranks to enable further reduction in memory access granularity and/or more efficient use of signaling resources. Also, while the memory module 203 is depicted in system 200 and in detail view 209 as having a single memory rank, two or more memory ranks per module may be provided in alternative embodiments, with each memory rank separately divided into two or more sub-ranks which can be independently accessed.

FIG. 2B illustrates a pipelined sequence of memory transactions that may be carried out within the memory system of FIG. 2A. Starting at clock cycle 0, the memory controller initiates a memory access in sub-rank A (i.e., memory device set 205 of FIG. 2A) by activating chip-select line CS-A (i.e., as shown by the logic '1' state of CS-A during clock cycle 0) and outputting a row activation command (ACT) on the shared command/address path, CA. The memory controller also deactivates chip-select line CS-B (i.e., deasserting the chip-select signal on that chip-select line) during clock cycle 0 so that the memory devices 205 of sub-rank A, and not the memory devices 207 of sub-rank B, are enabled to receive the row activation command and associated row address (i.e., the memory devices of sub-rank A are enabled to sample the signals on the command/address path during clock cycle 0). Accordingly, each of the memory devices of sub-rank A respond to the cycle-0 activation command by performing a row-activation operation (i.e., transferring contents of the address-specified row of storage cells to a sense amplifier bank), thus establishing an activated row of data which may be read from and written to in one or more subsequent column access operations.

In clock cycle 1, the memory controller maintains chip-select line CS-A in the activated state (CS-A='1') and chip-select line CS-B in the deactivated state (CS-B='0'), and outputs a column access command and associated address value via the command/address path. By this operation, the column access command, a column read command (RD) in this particular example, is received and executed within memory sub-rank A, but not memory sub-rank B. Accordingly, a predetermined time after receipt of the column read command (i.e., $T_{RD}$, shown to be two clock cycles in this example), data retrieved within the sub-rank A memory devices 205 in response to the cycle-1 column read command is output onto component data path DQ-A. In the example shown, the output burst length includes eight transmissions (numbered 0-7) that are synchronized with successive rising and falling edges of the clock signal (Clk) so that the overall read data transmission in response to the cycle-1 column read command extends over the four clock cycles numbered 4-7. There may be more or fewer data transmissions per clock cycle in alternative embodiments. Also, in the example shown, the row activation command and column read command are shown as being received in back-to-back clock cycles. There may be one or more intervening clock cycles or fractions of clock cycles between receipt of row activation commands and column access commands in alternative embodiments.

During clock cycles 2 and 3, chip-select line CS-A is deactivated and chip-select line CS-B is activated to enable the sub-rank B memory devices, but not the sub-rank A memory devices, to receive an activate command and column read command. By this operation, an independent memory access operation, including a row activation and a column access, are initiated within the sub-rank B memory devices while the previously-initiated memory access operation within the sub-rank A memory devices is ongoing. Because the cycle 2-3 memory access commands (i.e., row activation command and column read command transmitted during clock cycles 2 and 3, respectively) are received within the sub-rank B memory devices 207 with a two-clock-cycle latency relative to receipt of the cycle 0-1 memory access commands within sub-rank A, the overall memory access within memory sub-rank B is time-staggered (i.e., time-delayed) relative to the memory access within sub-rank A, with the data retrieved within the sub-rank B memory devices in response to the cycle-3 column read command being output onto data path DQ-B starting at clock cycle 6 and extending through clock cycle 9. Thus, during clock cycles 6 and 7, data from the two independent memory accesses within memory sub-ranks A and B are output concurrently onto respective portions of the overall data path, DQ, between the memory controller 201 and memory module 203. During clock cycles 4 and 5, after sufficient time has passed to enable a new memory access within memory sub-rank A, chip-select line CS-A is re-activated and chip-select line CS-B is deactivated to initiate a new memory access operation exclusively within memory sub-rank A in response to the activation and column read commands and associated addresses driven onto the command/address path by the memory controller. Accordingly, at clock cycle 8, a $T_{RD}$ interval after receipt of the cycle-5 column read command, an output data burst is begun on DQ-A in response to the cycle-5 column read command, with the burst extending from clock cycle 8 to clock cycle 11 and thus concurrently with the final four transmissions of the preceding sub-rank B memory access in clock cycles 8-9. Although $T_{RD}$ is depicted as a two-clock-cycle interval in FIG. 2B and other Figures described below, $T_{RD}$ may, in all such cases, be longer than two clock cycles in alternative embodiments. During clock cycles 6 and 7, after sufficient time has passed to enable a new memory access within memory sub-rank B, chip-select line CS-B is re-activated and chip-select line CS-A is deactivated to initiate a new memory access operation exclusively within memory sub-rank B in response to the activation and column read commands and associated addresses driven onto the command/address path by the memory controller, thereby producing an output data burst starting at clock cycle 10 and extending to clock cycle 13 and thus concurrently with the final four transmissions of the preceding sub-rank A memory access in clock cycles 10-11. The alternating accesses to different memory sub-ranks may be repeated for any number of subsequent clock cycles to effect a steady stream of time-interleaved, independent accesses to memory sub-ranks A and B. As illustrated in FIG. 2B, such operation results in full utilization of the available command/address bandwidth and the data path bandwidth (i.e., there are no gaps in the command transmission or data transmission during periods of peak demand). Further, because the memory accesses directed to the memory sub-ranks are carried out independently (i.e., with independent row and/or column addresses applied within each sub-rank), the total amount of data returned per memory access is halved relative to the amount of data returned by an embodiment that applies each memory access command and associated address values within all the memory devices of a memory rank.

FIG. 3A illustrates an embodiment of a memory module 250 having memory devices that may be programmed to establish a desired delay between receipt of a column access command and data output (an interval referred to herein as output latency), and thus enable the data output times of independent memory accesses directed to memory devices 251 and 253 that constitute distinct memory sub-ranks (A and B) to start and end at the same time rather than being staggered as shown in FIG. 2B. In the embodiment of FIG. 3A, for example, respective control registers within the memory devices 253 of sub-rank B are programmed to establish an output latency of 'x' (e.g., 'x' indicating a delay of an integer or fractional number of clock cycles, including zero), while the control registers within the memory devices 251 of sub-rank A are programmed to establish an output latency of 'x+2.' By this arrangement, the output data burst from memory sub-rank A in response to memory access commands received during clock cycles 0-1 is delayed by an additional two clock cycles, as shown in FIG. 3B, so that the output data bursts for the independent memory access operations within memory sub-ranks A and B (as enabled by the staggered assertion of chip-select signals CS-A and CS-B and the two sets of memory access commands output during clock cycles 0-1 and 2-3, respectively) start and end at the same time, extending from clock cycle 6 to clock cycle 9. While this approach adds additional latency in the sub-rank A memory access (i.e., two clock cycles beyond the $T_{RD}$ that would otherwise apply), the fully overlapped data transfer for the two memory transactions directed to the A and B sub-ranks may simplify data transfer timing within the memory controller or other system components.

FIG. 3C illustrates an embodiment of a latency-control circuit 270 that may be provided within individual memory devices to establish selected output latencies. As shown, the output data path 276 within a given memory device is supplied to a sequence of 'n' daisy-chained flip-flop stages $281_1$-$281_n$ (other storage elements may be used) that are clocked by a clock signal, dclk. By this operation, the output of each flip-flop stage is one dclk cycle delayed relative to the output of the preceding stage, thus yielding n+1 data output paths 278 having respective latencies of zero to 'n' dclk cycles. The data output paths 278 are supplied to a multiplexer 283 or other selection circuit which selects one of the data output paths in accordance with an output latency value 277 (OL), programmed within register 275 (or established by an external pin, or a configuration circuit implemented, for example by an internal fuse, anti-fuse, non-volatile storage element, etc.), to pass the data the selected data output path to a bank of memory device output drivers 285 which, in turn, output the data onto an external data path via interface 286. Note that dclk may be a higher-frequency clock signal than the system clock signal, Clk, supplied by the memory controller (i.e., as described in reference to FIGS. 2A-2B), thereby enabling output latencies in fractions of cycles of the system clock signal.

Although the examples of concurrent, independent memory access operations within the A and B memory sub-ranks have been thus far described in terms of memory read operations, concurrent, independent memory write operations may also be carried out in the A and B memory sub-ranks, with write data for the operations being transmitted by the memory controller either in time-staggered fashion (e.g., as in FIG. 2B) or in complete alignment as in FIG. 3C and received concurrently within the A and B memory sub-ranks. Also, a memory read operation may be carried out within one memory sub-rank concurrently with a memory write operation within another. Referring to FIG. 4, for example, a memory write command sequence (e.g., row activation command, ACT, followed by column write command, WR) is issued to memory sub-rank B immediately after a memory read command sequence (ACT, RD) to memory sub-rank A. In the particular example shown, write data (Write Data) is transmitted to the memory devices of sub-rank B immediately after receipt of the column write command (i.e., starting in clock cycle 5) and thus is received in the memory devices of sub-rank B concurrently with transmission of read data (Read Data) by the memory devices of sub-rank A. Different timing relationships may be established between transmission of read and write data in alternative embodiments.

FIG. 5A illustrates an embodiment of a memory module 300 that supports independent access to memory sub-ranks 301 and 303 using a shared chip-select line (CS) instead of the split select-line approach shown in FIG. 2A. As shown, memory sub-ranks A and B (301 and 303) are coupled to shared command/address and clock lines (CA and CLK) and to respective data paths, DQ-A and DQ-B, as in FIG. 2A, but a single chip-select line, CS, is coupled to all the memory devices within the rank (i.e., all the memory devices within memory sub-rank A and memory sub-rank B). To enable independent memory commands to be received within the A and B memory sub-ranks, a delay interval between chip-select line activation and sampling of the command/address paths—an interval referred to herein as a sampling latency—is established within the memory devices 303 of sub-rank B, so that command path sampling occurs at a later time within memory sub-rank B than within memory sub-rank A. More specifically, by setting the sampling latency within each memory device 303 of sub-rank B to match the timing offset between transmission of distinct memory access command sequences on the shared command/address path, the shared chip-select line may be activated to trigger sampling of the command/address path within the memory devices 301 of sub-rank A during a first command interval and to trigger sampling of the command/address path within the memory devices 303 of sub-rank B during a subsequent command interval and thus enable time-multiplexed transfer of distinct memory access commands to the A and B memory sub-ranks.

FIG. 5B illustrates an embodiment of a sampling-latency control circuit 315 that may be included within individual memory devices to control command/address sampling latencies and thus enable different sampling latencies to be established within different memory sub-ranks. As shown, a sampling-latency value 318 (SL) is programmed within a configuration register 317 or established by strapping one or more external pins or programming a configuration circuit (implemented, for example by an internal fuse, anti-fuse, non-volatile storage element, etc.) to select either an incoming chip-select signal 316 or a two-cycle delayed instance of the chip-select signal 320 (e.g., generated by propagation of the incoming chip-select signal 316 through a pair of daisy-chained flip-flops $319_1$-$319_2$ or other clocked storage circuits) to be output from multiplexer 321 as a sample-enable signal, SE. The sample-enable signal may be applied, in turn, to enable signal receiver circuits within the memory device to sample command and address signals present on the command/address path. Thus, sampling latencies of zero clock cycles and two clock cycles may be programmed within the memory devices 301 and 303, respectively, of FIG. 5A so that, as shown in FIG. 5E, activation of the shared chip-select line (CS) during clock cycles 0 and 1 will result in assertion of sample enable signals SE(A) within the memory devices of sub-rank A during clock cycles 0 and 1, and assertion of sample enable signals SE(B) within the memory devices of sub-rank B during clock cycles 2 and 3. By this operation, the row activation and column access commands (e.g., ACT, RD) transmitted by the memory controller during clock cycles 0 and 1 will be received and executed exclusively within the sub-rank A memory devices 301, and the row activation and column access commands transmitted during clock cycles 2 and 3 will be received and executed exclusively within the sub-rank B memory devices, thus enabling concurrent, independent memory accesses to be executed within memory sub-ranks A and B with the concurrent, time-staggered output data bursts shown in FIG. 5E.

FIG. 5C illustrates an alternative embodiment of a circuit 330 for controlling the command/address sampling latency within a memory device. Instead of providing programmable selection of the sampling latency as in FIG. 5B, separate chip-select inputs, CS1 and CS2, are provided for each memory device, with chip-select input CS1 being coupled without intervening latency logic to a first input of OR gate 331 and chip-select input CS2 coupled to a second input of OR gate 331 via a pair of daisy-chained flip-flops $319_1$ and $319_2$ (note that both chip-select inputs may be buffered by an input amplifier and/or latch, and include electrostatic-discharge (ESD) or other input protection circuitry). By this arrangement, the sample-enable signal (SE) output by OR gate 331 may be asserted at different times relative to chip-select line activation according to which of the two chip-select inputs (CS1, CS2) the chip-select line is coupled. That is, activation of a chip select line (CS) coupled to chip-select input CS1 will result in assertion of the sample-enable signal with negligible delay (SL=0), while activation of a chip select line coupled to chip-select input CS2 will result in assertion of the sample-enable signal after a two-clock-cycle delay (SL=2). Note that additional synchronizing elements may be provided in either or both of the chip-select input paths (or at the output of OR gate 331) to synchronize sample-enable signal assertion with a desired command/address sampling instant. The unused chip-select input may be grounded to prevent glitches in the sample-enable signal. In yet another embodiment, two daisy-chained delay flip-flops may be placed in the chip-select signal path on the memory module between the connection points to the memory devices of sub-rank A and the connection points to the memory devices of sub-rank B. The functional behavior is similar to that of the embodiment discussed in reference to FIG. 5C, except that the two flip-flops are not added to each of the memory devices but instead are added to the memory module as a separate device (or devices).

FIG. 5D illustrates a memory module 345 having dual-chip-select memory devices (Mem) as in FIG. 5C, and an exemplary connection of a shared chip-select line (CS) to the memory devices (Mem) to establish memory sub-ranks A and B. More specifically, the chip-select line is coupled to the CS1 inputs of the memory devices of sub-rank A and to the CS2 inputs of the memory devices of sub-rank B, thereby enabling the staggered command/address sampling within the A and B sub-ranks shown in FIG. 5E. The unused chip-select input of each memory device (i.e., CS2 inputs of sub-rank A memory devices and CS1 inputs of sub-rank B memory devices) is grounded.

Reflecting on the staggered command/address sampling that results from the different sampling latencies established within the A and B memory sub-ranks, it can be seen that any assertion of the chip-select line will result in command/address sampling within both memory sub-ranks, though at different times. Accordingly, if, during a given interval, a memory operation is to be carried out within one of the memory sub-ranks, but not the other, place-holder "no-operation" commands (i.e., NOPs) may be transmitted during the command interval for the non-elected memory sub-rank. Referring to FIG. 5E, for example, if no memory access is to be initiated within memory sub-rank B during command interval 360, NOP commands may be sent during that interval with the resulting non-transmission of data during interval 362.

FIG. 6A illustrates an alternative embodiment of a memory module 380 that supports independent access to memory sub-ranks using a shared chip-select line. As shown, memory devices 381 and 383 (i.e., memory sub-ranks A and B) are coupled to respective data paths, DQ-A and DQ-B, and to shared command/address (CA), clock (CLK) and chip-select lines (CS) as in FIG. 5A. Instead of staggering the response to chip-select signal assertion, however, different chip-select assertion polarities are established within the memory devices of the A and B memory sub-ranks so that a logic high chip-select signal (Active High CS) constitutes a chip-select signal assertion within the memory devices 381 of sub-rank A and a logic low chip-select signal (Active Low CS) constitutes a chip-select signal assertion within the memory devices 383 of sub-rank B. By this arrangement, when the chip-select signal is high, the memory devices 381 within memory sub-rank A are enabled to sample the command path, and when the chip-select signal is low, the memory devices 383 within memory sub-rank B are enabled to sample the command path, thus enabling time-multiplexed transfer of distinct memory access commands to the A and B memory sub-ranks using a shared chip-select line.

FIG. 6B illustrates an embodiment of a level control circuit 390 that may be included within the individual memory devices 381, 383 of FIG. 6A to control chip-select assertion polarity. As shown, a level-select value 392 (LS) is programmed within a configuration register 391 or established by strapping one or more external pins or programming a configuration circuit (implemented, for example by an internal fuse, anti-fuse, non-volatile storage element, etc.) and supplied to an input of exclusive-OR gate 393 to enable either a logic-high or logic-low state of a chip-select signal (supplied to the other input of the exclusive-OR gate 393) to trigger assertion of a sample-enable signal, SE. That is, if the level-select value 392 is low (i.e., results in a logic-low input to exclusive-OR gate 393), active-high chip-select is selected so that a logic-high chip-select signal will result in assertion of the sample enable signal at the output of exclusive-OR gate 393. By contrast, if the level-select value 392 is high ('1'), active-low chip-select is selected so that a logic-low chip-select signal will result in assertion of the sample enable signal at the output of exclusive-OR gate 393. As in the embodiment of FIGS. 5B and 5C, the sample-enable signal may be used to enable signal receiver circuits within the memory device to sample command and address signals present on the command/address path. Thus, level-select values that correspond to active-high and active-low chip-select signals may be programmed within the sub-rank A and sub-rank B memory devices, respectively, so that alternating high and low chip-select signals may be output to raise sample-enable signals within the memory devices of sub-ranks A and B at time-staggered intervals and thus effect concurrent, independent memory accesses within memory sub-ranks A and B as shown in FIG. 5E. Also, as in the embodiments described in reference to FIGS. 5A-5E, no-operation commands may be transmitted during unused command intervals.

FIG. 6C illustrates an alternative embodiment of a circuit 400 for controlling the chip-select assertion polarity in a memory device. Instead of providing programmable polarity selection as in FIG. 6B, separate chip-select inputs, CS+ and CS−, are provided, with chip-select input CS+ being coupled without intervening level-changing logic to a first input of logic OR gate 403 and chip-select input CS− coupled to a second input of OR gate 403 via inverter 401 (note that both inputs, CS+ and CS−, may be buffered by an input amplifier and/or latch, and include electrostatic-discharge (ESD) or other input protection circuitry). By this arrangement, the sample-enable signal (SE) output by the OR gate 403 may be asserted in response to different levels of the incoming chip-select signal according to which of the two chip-select inputs the chip-select line, CS, is coupled. That is, driving a chip select line coupled to chip-select input CS+ to a logic-high level will result in assertion of the sample-enable signal, while driving a chip-select line coupled to chip-select input CS− to a logic-low level will result in assertion of the sample-enable signal. Accordingly, independent memory accesses may be directed to the A and B sub-ranks of a memory module by coupling the memory devices within different sub-ranks generally as shown in FIG. 5D, with the CS1 and CS2 designation changed to CS+ and CS−, and with non-coupled CS− inputs tied high and non-coupled CS+ inputs tied low as shown in FIG. 6C at 404. Note that a NOP command may be issued on the command/address path (CA) when a sub-rank is not to be used during a particular cycle. Also, in yet another embodiment, an inverter is placed in the chip-select signal path on the memory module between the connection points to the memory devices of sub-rank A and the connection points to the memory devices of sub-rank B. The functional behavior is similar to that of the embodiment discussed in reference to FIG. 6C, except that the inverter is not added to each of the memory devices but instead is added to the memory module as a separate device.

FIGS. 7A-7C illustrate an alternative approach for enabling independent access to memory sub-ranks. Instead of providing separate chip-select lines, different chip-select-responsive sample latency, or different chip-select assertion polarities, the memory devices of different memory sub-ranks may be programmed or hardwired with sub-rank-specific device identifiers (IDs) that may be compared with counterpart identifiers within incoming commands. Thus, as shown in the exemplary memory module 420 of FIG. 7A, each of the memory devices of memory sub-rank A may be assigned device ID 'A', and each of the memory devices of memory sub-rank B may be assigned device ID 'B' so that incoming commands bearing device IDs that match one memory sub-rank or the other (i.e., 'A' or 'B') are received, at least in part, in all memory devices within a given rank (i.e., due to shared chip-select line, CS), but executed only in the specified sub-rank of memory devices having device IDs that match the incoming ID. A special device ID code or command code may be used to select both the sub-rank A and sub-rank B memory devices to enable a commanded operation to be carried out within all the memory devices of a rank or even multiple ranks.

FIG. 7B illustrates an embodiment of a device ID discriminator circuit 430 that may be included within memory devices to determine whether the ID value associated within an incoming command (i.e., the command ID) matches a device ID that has been established for the memory device and, if so, assert an enable signal to enable command execution. More specifically, a command/address value received via a command/address path CA is sampled within receiver 431 when the chip-select line (CS) is activated, with the received command (and/or associated address value) being stored within a command buffer 433 (note that chip-select may be omitted, with all commands being received and selectively responded to according to the device ID). One or more bits of the command that form the command ID (Cmd ID) are output from the command buffer 433 to a comparator circuit 435 which also receives the device ID (Device ID). The device ID itself may be established through register programming (e.g., programming a register at initialization time using a signaling protocol or other arrangement that enables a particular device or sub-rank of memory devices to receive a unique device identifier), production-time configuration (e.g., fuse-blowing or other operation to establish a non-volatile ID assignment within a configuration circuit of the memory device) or strapping (i.e., coupling selected input contacts or pins of the memory device to particular reference voltages to establish a device ID setting). However established, the device ID and command ID are compared within the comparator circuit 435 (which may be implemented, for example, by one or more exclusive-NOR gates that compare constituent bits of the command ID with corresponding bits of the device ID) which asserts an enable signal (EN) if the command ID and device ID match. The comparator circuit 435 may additionally include logic to detect a rank ID code (e.g., which may be issued by the memory controller if operating the memory sub-ranks as a unified rank) or multi-rank ID (e.g., for enabling command execution in multiple ranks of memory devices) and assert the enable signal in response. A command logic circuit 437 is coupled to receive the command from the command buffer 433 and to the enable output of the comparator circuit 435 and responds to assertion of the enable signal by executing the command. Thus, as shown in FIG. 7C, memory access commands (e.g., including activation (ACT) and column access commands (RD, WR)) bearing a command ID that matches the sub-rank A memory device IDs will be executed within the sub-rank A memory devices, while memory access commands bearing IDs that match the sub-rank B memory devices are executed within the sub-rank B memory devices. If no command is to be conveyed during a given command interval, as shown at 445, the shared chip-select signal may be deasserted (e.g., as shown by the logic '0' state of line CS), so that the command path is not sampled (and thus may have any state as shown by don't care symbols 'XX'). Note that, in a memory module that has only two memory sub-ranks per memory rank, a single-bit device ID value and single-bit command ID are sufficient for distinguishing the two memory sub-ranks. Accordingly, any signal line of the command path or other signal line between the memory controller (e.g., clock-enable line, row-address strobe, column address strobe, data mask line, etc.) may be used to convey a device ID bit or, more generally, act as a sub-rank select signal.

Although embodiments of memory modules have thus far been described as having a single memory rank, a memory module may alternatively have two or more memory ranks, each memory rank or any one of them including separately accessible memory sub-ranks. FIG. 8, for example, illustrates a memory module 500 having two ranks of memory devices 510 and 520 disposed on opposite sides of a substrate 501. Dividing line 502 corresponds to a top edge of the substrate as shown in perspective view 509. Each of the memory ranks 510, 520 is coupled in common to a clock line, CLK, and command/address path, CA (e.g., with the clock and command lines disposed on either side of the memory module coupled to one another through vias or by contact with a common interconnection receptacle or terminal when inserted into a connector), but to separate pairs of chip-select lines, CS-A/CS-B and CS-C/CS-D. By this arrangement, either of the memory ranks 510, 520 may be selected for rank-wide memory access through activation of the corresponding pair of chip-select lines (i.e., CS-A/CS-B or CS-C/CS-D), or two independent, concurrent memory accesses may be initiated within the pair of memory sub-ranks 205/207 or 505/507 of either rank by time-staggered assertion of chip-select signals for the constituent sub-ranks as described in reference to FIGS. 2A-2B. Also, as discussed above, memory access within a single sub-rank may be carried out without access to the counterpart sub-rank (e.g., 205/507 or 505/207). Also, instead of providing multiple chip-select lines per memory rank to permit independent sub-rank access, any of the techniques described above for enabling independent sub-rank access with a shared chip-select line may be applied.

FIG. 9 illustrates an embodiment of a data processing system 600 having a processing unit 601 (i.e., one or more processors and/or other memory access requestors) and a memory subsystem 605 that supports concurrent, independent access to memory sub-ranks on one or more memory modules. As shown, the memory subsystem 605 includes a memory controller 607 coupled to memory modules 621a-621n, with each memory module 621 including one or more discrete memory devices within memory sub-ranks 623 and 625 (i.e., sub-ranks A and B) and, optionally, a serial-presence detect memory 627 (SPD) or other non-volatile storage that provides characterizing information for the memory module and/or memory devices thereon. In one embodiment, the characterizing information may indicate whether the memory module supports memory accesses at sub-rank granularity and, if so, corresponding capabilities within the memory devices themselves (e.g., whether the devices include programmable registers to support selected support chip-select assertion polarities, sample-enable latencies, sub-rank ID value assignment, etc.). The characterizing information may include various other information relating to operation of the memory devices including, for example and without limitation, storage capacity, maximum operating frequency and/or other memory device characteristics. By this arrangement, the memory controller 607 may read the characterizing information from the SPD 627 for each memory module 621 (or an SPD or like device for the set of memory modules $621_1$-$621_N$) and identify one or more memory modules 621 as supporting independent access to memory sub-ranks. In one embodiment, the memory controller 607 may respond to characterizing information by programming sample-latencies, chip-select assertion polarities or device ID values within the memory devices of the memory modules 621 identified as having such devices. Alternatively, the memory controller 607 may return the characterizing information to the processing unit 601 which may itself be programmed (e.g., through a predetermined instruction/data set such as basic input-output service (BIOS) code) to issue instructions to the memory controller 607 to carry out the programming necessary to configure the memory modules 621 for independent access to selected memory sub-ranks.

With respect to sample-latency, chip-select assertion polarity and/or sub-rank ID selection within the memory devices of a given memory module 621, the memory controller 607 may dynamically transition the memory module 621 or any of the memory devices within the sub-ranks 623, 625 thereon between various program settings, for example, in response detecting a threshold density of fine-grained memory access requests (i.e., a threshold number of such access requests within a given time interval or as a threshold percentage of total memory access requests) from the processing unit 601 or in response to an explicit command from the processing unit 601 to establish particular program settings.

Within the memory controller 607, parallel transaction queues 609, 611 (TQueue) are provided to queue memory access commands (and associated read and write data) directed to respective memory sub-ranks 623, 625 of a selected memory module 621. Thus, in one embodiment, transaction queue 609 is coupled, via data path DQ-A, to memory sub-rank A 623 within each of the memory modules 621, while transaction queue 611 is coupled via data path DQ-B to memory sub-rank B within each of the memory modules 621. To enable selection of a module-specific memory sub-rank, each of the transaction queues 609 and 611 is coupled via respective chip-select line to each of the memory modules. That is, in one embodiment, there are N pairs of chip-select lines, with the chip-select lines of each pair extending to distinct memory sub-ranks on a respective one of memory modules $621_1$-$621_N$. Each of the transaction queues 609, 611 is additionally coupled to a respective one of internal command paths 610, 611 which are coupled, in turn, to inputs of a command path multiplexer 615. The command path multiplexer 615 responds to a source-select value, SSe1, to couple either internal command path 610 or internal command path 612 to command path, CA, and thus select either transaction queue 609 or transaction queue 611 to source the commands and associated address values for a given memory transaction. In one embodiment, a mode-select value (MSe1) within the memory controller 607 is used to control whether the transaction queues 609, 611 are operated in a sub-rank access mode or a unified-rank access mode. In the sub-rank access mode, the source-select value may be toggled (e.g., by control logic within the memory controller 607 or the transaction queues 609, 611) after each command output sequence from a given transaction queue to enable the alternate transaction queue to drive command path CA in the ensuing command interval. Alternatively, arbitration logic may be provided to enable arbitrated access to command path CA from the two transaction queues 609, 611. In unified-rank access mode, the command path may be driven exclusively by one transaction queue or the other, with chip-select signals for memory sub-ranks (and the data input/output circuitry within transaction queues or elsewhere within the memory controller 607) being operated in lock step instead of time-staggered. In addition to memory access commands and associated data, one or both of the transaction queues 609, 611 may output operational commands and associated data to the various memory modules 621, for example, to configure the memory devices of the module, (including programming sub-rank access functions such as sampling latency, chip-select assertion polarity, device ID, etc.), read the SPD, perform signaling calibration, refresh operations, and so forth. Such commands may be transmitted under direction of control logic within the memory controller 607 (e.g., in one or both of the transaction queues) or in response to access requests from the processing unit 601 received via host interface path 602 (which may include separate data (Data) and request components (Req) as shown or a time-multiplexed path).

Although memory modules 621 are depicted in the system of FIG. 9, the memory devices 625 that form each memory rank (and, optionally, associated or integrated SPD elements 627) may be mounted directly to a mother board, or integrated into a multi-chip module, along with the memory controller 607 and/or processing unit 601 to form, for example, a system-in-package (SIP) DRAM system or other system-on-chip (SOC) device. Thus, sub-ranked memory access is not limited to memory module operation, but rather may be effected in accordance with the above principles within any rank of memory devices so that reduced-granularity memory transactions may be carried out with data transfer over respective portions of a data path, and with commands sent over a shared command path. Also, the data paths (DQ-A and DQ-B), command/address path (CA) and other signaling paths or lines coupled between the memory controller 607 and memory devices of the various memory modules 621 may be implemented using virtually any signaling channel, including an electronic conduction path (e.g., wires or electronically conductive traces), an optical path or wireless signaling channel. Further, the processing unit 601, memory controller 607, and/or one or more of memory devices that populate the memory modules 621 may be combined on a single integrated circuit die in an alternative embodiment.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which logical elements may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory apparatus, comprising:
   a first discrete memory device;
   a second discrete memory device;
   a command bus interface;
   a data bus interface having a width with a first portion coupled to the first discrete memory device but not the second discrete memory device and a second portion coupled to the second discrete memory device but not the first discrete memory device;
   command bus interface logic, where
      in a first mode, a memory access command is interpreted as simultaneously directed to both of the first discrete memory device and the second discrete memory device to process a memory word sized to correspond to the width, and
      in a second mode, the memory access command is interpreted as directed to a selected one of the first discrete memory device or the second discrete memory device at a given instant in time to process a memory word sized to correspond to a respective one of the first portion or the second portion.

2. The memory apparatus of claim 1, embodied as a memory module.

3. The memory apparatus of claim 1, where the apparatus is embodied as a memory system that includes a memory controller.

4. The memory apparatus of claim 1, where the command bus interface logic interprets the memory access command to access each of the first discrete memory device and the second discrete memory device at non-overlapping points in time.

5. The memory apparatus of claim 4, where the command bus interface logic comprises a register to store a programmable latency for use in staggering output of one of the first discrete memory device or the second discrete memory device relative to the other of the first discrete memory device or the second discrete memory device during the second mode.

6. The memory apparatus of claim 1, where the command bus interface logic comprises a register to store a programmable command bus latency that during the second mode is to cause sampling of the command bus for one of the discrete memory devices in a time staggered manner relative to a common chip select, dependent upon the programmable command bus latency.

7. The memory apparatus of claim 1, where the command bus interface logic comprises a register to store a programmable command bus latency that during the second mode is to cause sampling of the command bus for each discrete memory device in a time staggered manner relative to each other, dependent upon the programmable command bus latency.

8. The memory apparatus of claim 1, where the apparatus is adapted to, when in the second mode, concurrently transmit read data for the first discrete memory device while receiving write data into the second discrete memory device.

9. The memory apparatus of claim 1, where:
the apparatus further comprises two chip selects;
in the first mode, one chip select is used to select both of the first discrete memory device and the second discrete memory device; and
in the second mode, one chip select each is dedicated to one of the first discrete memory device and the second discrete memory device, respectively.

10. The memory apparatus of claim 1, where:
the apparatus further comprises a chip select shared by the first discrete memory device and the second discrete memory device;
in the second mode, one of the first memory device or the second memory device is accessed using a logic-high value of the chip select, and the other of the first discrete memory device or the second discrete memory device is accessed using a logic-low value of the chip select.

11. The memory apparatus of claim 10, where the command bus interface logic comprises a register to store a programmable logic level value for use in programmably-defining a chip select assertion polarity for at least one of the first discrete memory device or the second discrete memory device.

12. The memory apparatus of claim 1, where:
each discrete memory device is associated with a dedicated device ID; and
the command bus interface logic further includes an ID discriminator circuit to determine whether an ID value of an incoming command matches an ID associated with one of the first discrete memory device or second discrete memory device.

13. The memory apparatus of claim 1, where the first portion is equal in size to the second portion, each of the first portion and the second portion equal to one-half of the width.

14. The memory apparatus of claim 1, where the command bus interface logic includes control circuitry of the first discrete memory device and control circuitry of the second discrete memory device.

15. A memory apparatus, comprising:
a first discrete memory device;
a second discrete memory device;
a command bus interface to provide commands to each of the first discrete memory device and the second discrete memory device;
a data bus interface having a width with a first portion coupled to the first discrete memory device but not the second discrete memory device and a second portion coupled to the second discrete memory device but not the first discrete memory device; and circuitry to cause each of the first discrete memory device and the second discrete memory device to respond to the same command for respective portions of a data word sized to correspond to the width or to different time-staggered commands for respective data words sized to correspond to a respective one of the first portion or the second portion, in dependence on an operating mode.

16. The memory apparatus of claim 15, embodied as a memory module.

17. The memory apparatus of claim 15, where the apparatus is embodied as a memory system that includes a memory controller.

18. The memory apparatus of claim 15, where the circuitry comprises a register to store a programmable latency for use in staggering output of one of the first discrete memory device or the second discrete memory device relative to the other of the first discrete memory device or the second discrete memory device.

19. The memory apparatus of claim 15, where the circuitry comprises a register to store a programmable command bus latency to cause sampling of the command bus for one of the discrete memory devices in a time staggered manner relative to a common chip select, dependent upon the programmable command bus latency.

20. The memory apparatus of claim 15, further comprising a mode register to store an indication of operating mode of the memory apparatus.

21. The memory apparatus of claim 15, where the command bus interface logic comprises a mode register to store a programmable command bus latency to cause sampling of the command bus for each discrete memory device in a time staggered manner relative to each other, dependent upon the programmable command bus latency.

22. The memory apparatus of claim 15, where the apparatus is adapted to, dependent on the operating mode, concurrently transmit read data for the first discrete memory device while receiving write data into the second discrete memory device.

23. The memory apparatus of claim 15, where:
the apparatus further comprises two chip selects;
in a first operating mode, one chip select is used to select both of the first discrete memory device and the second discrete memory device; and
in a second operating mode, one chip select each is dedicated to one of the first discrete memory device and the second discrete memory device, respectively.

24. The memory apparatus of claim 15, where:
the apparatus further comprises a chip select shared by the first discrete memory device and the second discrete memory device;
dependent upon the operating mode, one of the first memory device or the second memory device is accessed using a logic-high value of the chip select, and the other of the first discrete memory device or the second discrete memory device is accessed using a logic-low value of the chip select.

25. The memory apparatus of claim 15, where:
each discrete memory device is associated with a dedicated device ID; and
the circuitry further includes an ID discriminator circuit to determine whether an ID value of an incoming command matches an ID associated with one of the first discrete memory device or second discrete memory device.

26. The memory apparatus of claim 15, where the first portion is equal in size to the second portion, each of the first portion and the second portion equal to one-half of the width.

27. The memory apparatus of claim 15, where the circuitry includes control circuitry of the first discrete memory device and control circuitry of the second discrete memory device.

28. A memory apparatus, comprising:
- a first memory array;
- a second memory array;
- a shared command bus interface to provide commands to each of the first memory array and the second memory array;
- a first data path for the first memory array, not shared by the second memory array, and a second data path for the second memory array, not shared by the first memory array; and
- means for causing the first memory array to respond to a command received via the command bus in response to a first chip select using the first data path, and means for causing the second memory array to respond to a command received via the command bus in response to a selective one of the first chip select or a second chip select using the second data path, where the first memory array and the second memory array are to process to respective portions of a data word in a first operating mode, and the first memory array and second memory array are to process respective data words in a second operating mode.

29. The memory apparatus of claim 28, where the shared command bus interface is to receive an independent chip select signal for each of the first memory array and the second memory array.

30. The memory apparatus of claim 28, where the shared command bus interface is to receive a chip select signal shared by the first memory array and the second memory array, and where the means for causing includes circuitry to cause each of the first memory array and the second memory array to respond at different times to the shared chip select signal.

31. The memory apparatus of claim 28, where each of the first memory array and the second memory array comprises a discrete memory device.

\* \* \* \* \*